(12) United States Patent
Arai (10) Patent No.: US 6,376,871 B1
(45) Date of Patent: Apr. 23, 2002

(54) SEMICONDUCTOR DEVICE HAVING PHOTODETECTOR AND OPTICAL PICKUP SYSTEM USING THE SAME

(75) Inventor: Chihiro Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/641,544

(22) Filed: Aug. 18, 2000

(30) Foreign Application Priority Data

Aug. 23, 1999 (JP) .......................................... P11-235760

(51) Int. Cl.⁷ ............................................... H01L 21/76
(52) U.S. Cl. ....................... 257/290; 257/293; 257/290; 369/44.12
(58) Field of Search ...................... 438/73, 57; 257/463, 257/434, 435, 292, 294, 293, 437; 369/44.12

(56) References Cited

U.S. PATENT DOCUMENTS 5,466,962 A * 11/1995 Motohiko et al. .......... 257/437

* cited by examiner

*Primary Examiner*—Charles Bowers
*Assistant Examiner*—David C Finsmith
(74) *Attorney, Agent, or Firm*—Sonnenschein, Nath & Rosenthal (57) ABSTRACT

A semiconductor device includes a photodetector having a junction at which a first conductive type first semiconductor portion and a second conductive type second semiconductor portion are joined to each other. In this photodetector, division regions are formed in part of the first semiconductor portion in such a manner as to cross the first semiconductor portion and partially enter the second semiconductor portion, so that the junction is divided into a plurality of parts by the division regions, to form a plurality of photodetector regions having the divided junction parts. When a reverse bias voltage, which is equal to or less than a specific reverse bias voltage applied to the divided junction parts upon operation of the photodetector, is applied to the divided junction parts, depletion layers originated from two divided junction parts, disposed on both the sides of each of the division regions, of the plurality of divided junction parts extend, in the second semiconductor portion, under the division region to be brought into contact with each other. With this configuration, the frequency characteristic and the light receiving sensitivity of the photodetector are improved.

8 Claims, 7 Drawing Sheets

SEMICONDUCTOR DEVICE HAVING PHOTODETECTOR AND OPTICAL PICKUP SYSTEM USING THE SAME

RELATED APPLICATION DATA

The present application claims priority to Japanese Application No. P11-235760 filed Aug. 23, 1999, which application is incorporated herein by reference to the extent permitted by law.

BACKGROUND OF THE INVENTION

The present invention relates to a semiconductor device having a photodetector and an optical pickup system using the semiconductor device.

A photodiode as a photodetector capable of converting a light signal into an electric signal has been extensively used for optical sensors for controlling various kinds of photo-electric converters, for example, an optical sensor for obtaining a recording information signal (hereinafter, referred to as "RF signal"), a tracking error signal, a focusing error signal, and the like in a so-called optical pickup system for recording and/or reproducing light signals on and/or from an optical recording medium.

A photodetector is formed, together with various circuit elements such as a bipolar transistor, resistance, and capacitor, on a common semiconductor substrate, to be thus configured as a so-called photo-IC (Integrated Circuit). Such a photo-IC is generally fabricated in accordance with a method of fabricating a bipolar transistor as one of the above-described circuit elements.

As a photo-IC having a fast, high-sensitive photodetector, there has been proposed a photo-IC including a high resistance expitaxial semiconductor layer.

Figure 5:
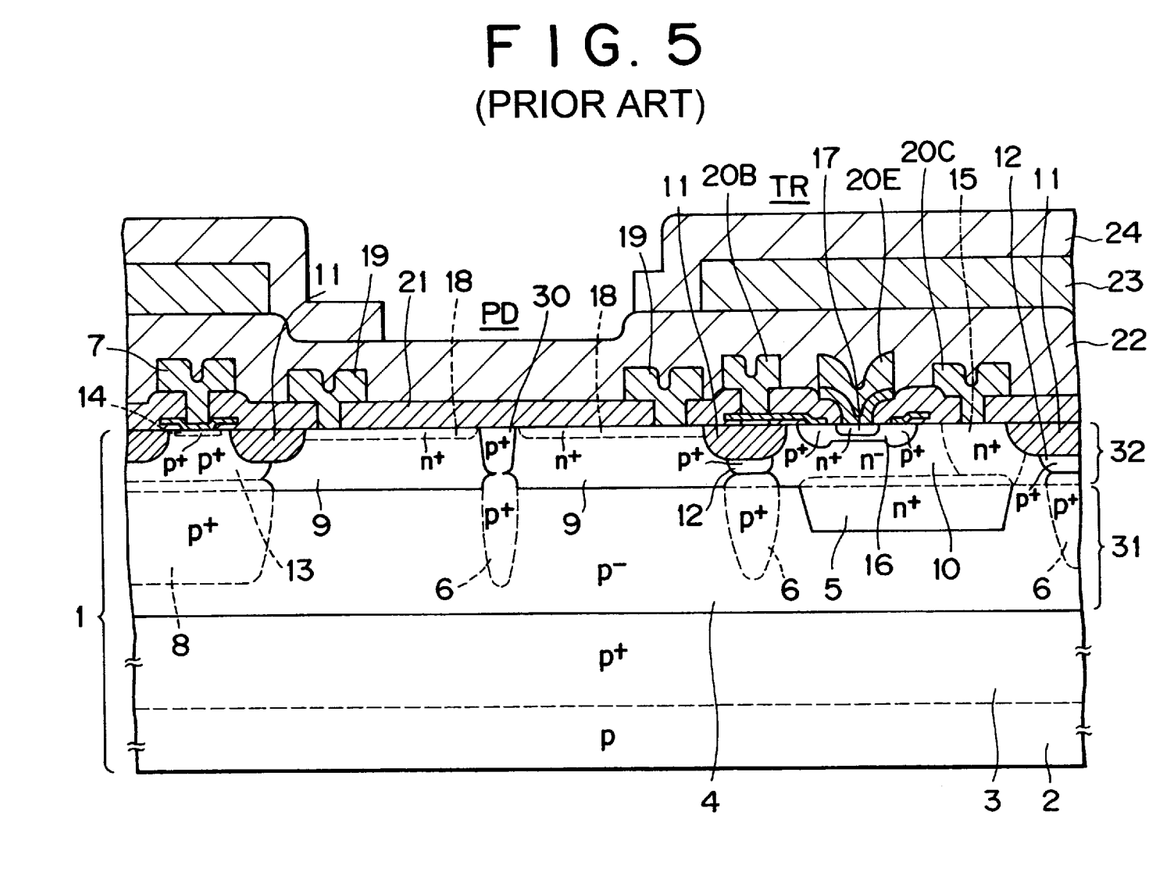
FIG. 5 is a schematic sectional view of a prior art semiconductor device

FIG. 5 is a schematic sectional view showing a prior art photo-IC on which a photodiode PD as a photodetector and a bipolar transistor TR are mixedly formed. The photo-IC shown in FIG. 5 has a configuration of a bipolar IC on which an npn type transistor TR and an anode common type photodiode PD are formed on the same semiconductor substrate 1.

The method of fabricating the bipolar IC will be described below. A high impurity concentration p-type buried layer 3 is formed on the entire principal plane of a p-type Si semiconductor base substrate 2, and a low impurity concentration p-type first semiconductor layer 31 for forming an anode region 4 of the photodiode PD is formed on the buried layer 3 by epitaxial growth. A high impurity concentration collector buried region 5 is formed on a transistor TR formation area of the first semiconductor layer 31. High impurity concentration buried isolation regions 6 are selectively formed in order to isolate circuit elements from each other and to divide the photodiode PD into parts (as will be described below). A high impurity concentration p-type buried region 8 is formed, simultaneously with the formation of the buried isolation regions 6, under a contact of an anode electrode 7 of the photodetector PD.

A low impurity concentration n-type second semiconductor layer 32 for forming a cathode region 9 of the photodiode PD and a collector region 10 of the transistor TR is formed on the first semiconductor layer 31 by epitaxial growth.

In this way, the first and second semiconductor layers 31 and 32 are formed on the semiconductor base substrate 2 by epitaxial growth, to form an Si semiconductor substrate 1. Insulating isolation layers 11 made from $SiO_2$ are formed, by a so-called LOCOS (Local Oxidation of Silicon), on the surface of the Si semiconductor substrate 1, that is, on the second semiconductor layer 31 in order to electrically isolate semiconductor circuits elements or regions from each other.

In the second semiconductor layer 32, a high impurity concentration p-type isolation region 12 is formed between the insulating isolation layer 11 and the buried isolation region 6 positioned thereunder at each insulating isolation portion between adjacent circuit elements. A high impurity concentration p-type anode electrode extraction region 13 is formed on the high impurity concentration buried region 8, and a high impurity concentration anode contact region 14 is formed on the anode electrode extraction region 13. A high impurity concentration p-type division region 30 is formed on the buried region 6, which is formed at the division region for dividing the anode region 4 into two parts, in such a manner as to be in contact with the region 6.

A high impurity concentration n-type collector electrode extraction region 15 and a p-type base region 16 are formed in the collector region 10. An n-type emitter region 17 is formed on the base region 16.

A high impurity concentration cathode region 18 is formed on each cathode region 9 of the photodiode PD, and a cathode electrode 19 is in ohmic-contact with the cathode region 18.

An insulating layer 21 made from $SiO_2$ is deposited on the surface of the semiconductor substrate 1, and electrode contact windows are formed in the insulating layer 21. An emitter electrode 20E, a base electrode 20B, and a collector electrode 20C of the transistor TR are brought into contact with the regions 15, 16 and 17 through the electrode contact windows, and an interlayer insulating layer 22 made from $SiO_2$ is formed thereon. A light shading layer 23 made from Al, which has a light receiving window, is formed on the interlayer insulating layer 22, and a protective layer 24 is formed thereon.

The photodiode PD is irradiated with a light ray to be detected through the light receiving window of the light shading layer 23. In this case, the insulating layers 21 and 22 act as a reflection preventive film.

The photodiode PD configured as the bipolar IC thus fabricated is used as a sensor for obtaining an RF signal, a tracking error signal, and a focus error signal in an optical pickup system for recording and/or reproducing light signals on and/or from an optical recording medium.

Figure 6A:
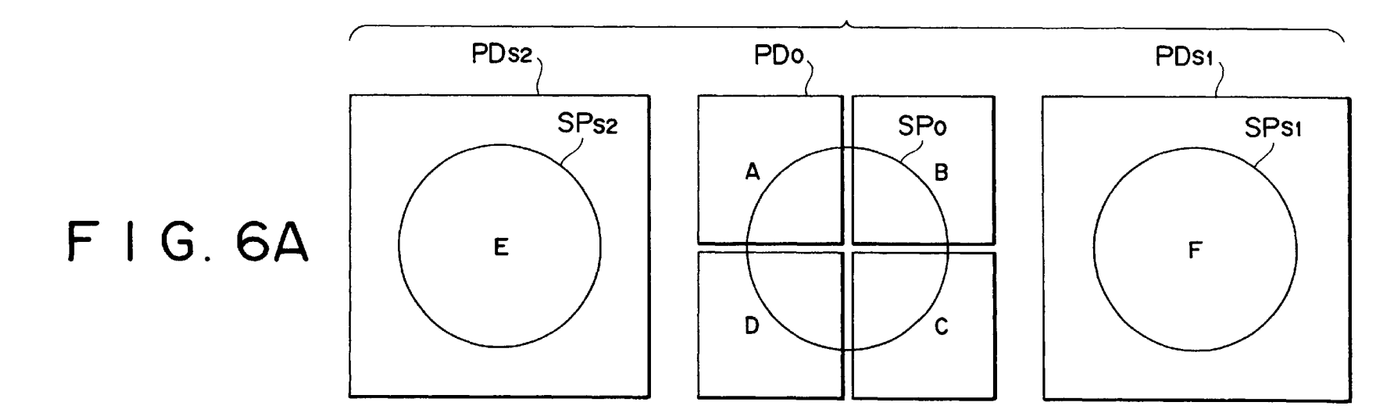
FIGS. 6A and 6B are diagrams each showing a pattern of a photodiode.

FIG. 6A shows a plane pattern of a photodiode PD used as a sensor for obtaining an RF signal, a tracking error signal, and a focus error signal in an optical pickup system. In this example, the photodiode PD includes a central photodiode $PD_0$ divided into four parts A, B, C and D in a cruciform and side photodiodes $PD_{S1}$ and $PD_{S2}$ disposed on both the sides of the central photodiode $PD_0$. Such a photodiode PD is irradiated with light from an optical recording medium, typical, an optical disk in such a manner that a central light spot $SP_0$ is formed on the central photodiode $PD_0$, and side spots $SP_{S1}$ and $SP_{S2}$ are formed on the side photodiodes $PD_{S1}$ and $PD_{S2}$, respectively. In this case, assuming that the outputs obtained by photoelectric conversion at the four divided parts A, B, C and D of the central photodiode $PD_0$ are taken as outputs A, B, C and D, the focus error signal is obtained by calculating an equation of (A+C)−(B+D), and assuming that the outputs from the side photodiodes $PD_{S1}$ and $PD_{S2}$ are taken as outputs E and F, the tracking error signal is obtained by calculating an equation of (E−F), and the signal readout signal, that is, RF signal is obtained by calculating an equation (A+B+C+D).

Figure 6B:
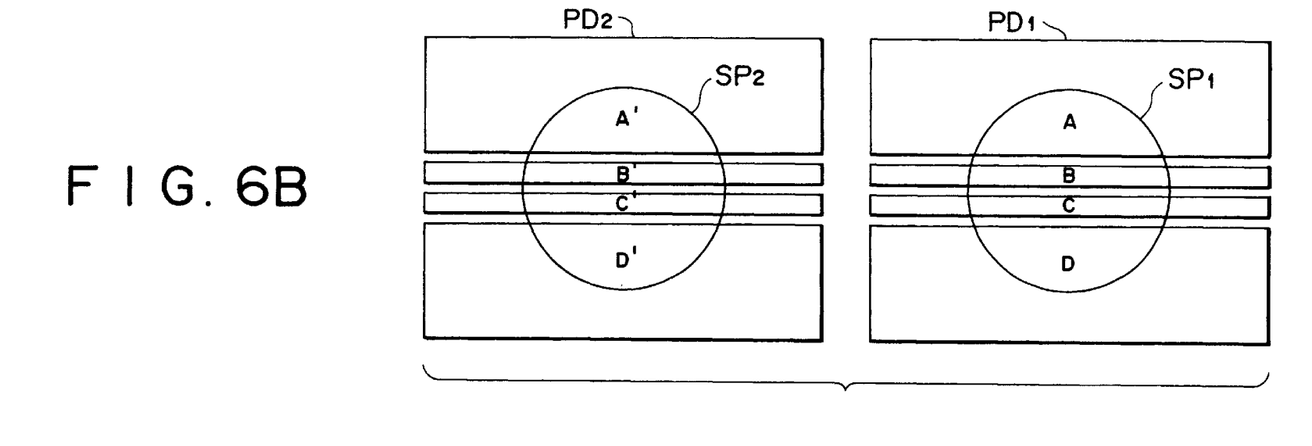

FIG. 6B shows another example of a photodiode PD applied to an optical pickup system. In this example, the photodiode PD includes a photodiode $PD_1$ divided in parallel into four parts A, B, C and D in which the center side divided parts B and C are each formed into an extremely thin stripe pattern with a pitch of 14 μm, and a photodiode $PD_2$ divided in parallel into four parts A', B', C' and D' in which the center side divided parts B' and C' are each formed into an extremely thin stripe pattern with a pitch of 14 μm. Such a photodiode PD is irradiated with light in such a manner that a light spot $SP_1$ is formed on the photodiode $PD_1$ and a light spot $SP_2$ is formed on the photodiode $PD_2$. In this case, assuming that the outputs from the divided parts A, B, C and D of the photodiode $PD_1$ are taken as outputs A, B, C, and D and the outputs from the divided parts A', B', C' and D' of the photodiode $PD_2$ are taken as outputs A', B', C' and D', the focus error signal is obtained by calculating an equation [(B+C)−(A+D)]−[(B'+C')−(A'+D')]; the tracking error signal is obtained by calculating an equation of (A+B+C'+D')−(C+D+A'+B'); and the RF signal is obtained by calculating an equation of (A+B+C+D)+(A'+B'+C'+D').

Figure 7:
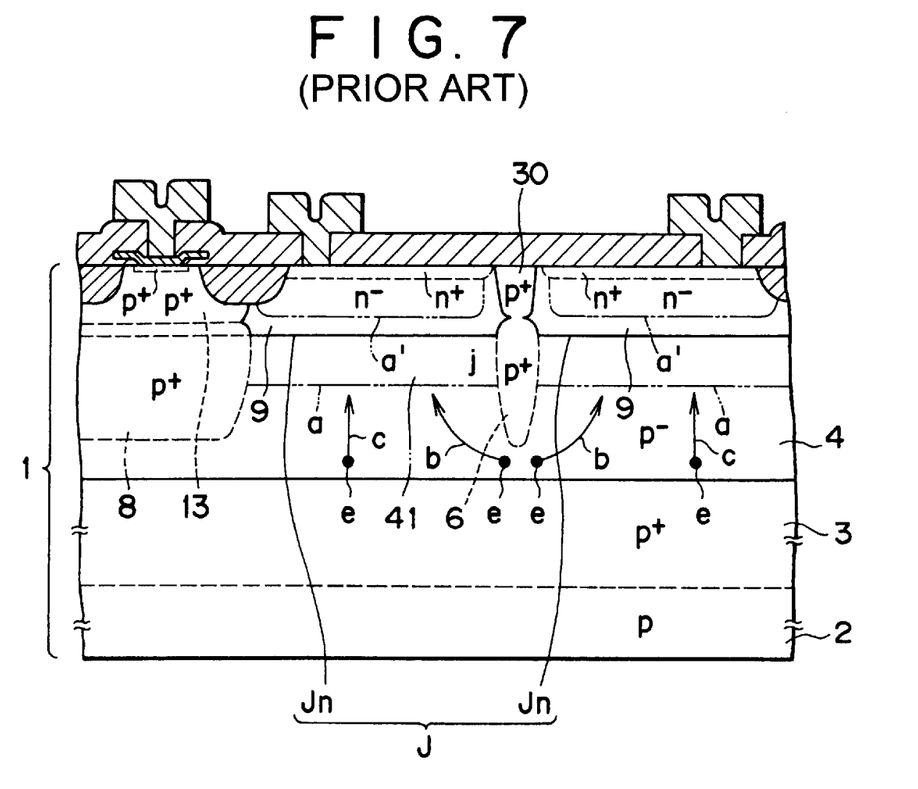
FIG. 7 is a schematic sectional view of an essential portion of the prior art semiconductor device for illustrating the operation of the semiconductor device.

A semiconductor device having a photodiode divided into a plurality of parts, for example, the above-described photodiode PD divided into four parts has a configuration shown in FIG. 7. FIG. 7 is a sectional view of an essential portion of the photodiode. As shown in this figure, a cathode region 9 is divided into two parts over the entire thickness by a division region 30 and a buried isolation region 9 formed under the division region 30.

According to the above-described prior art configuration, in a non-operated state in which no reverse bias voltage is applied to the photodiode PD, the cathode region 9 is perfectly divided into two parts by the division region 30 and the buried isolation region 6 formed under the division region 30. That is to say, the p-n junction J between the anode region 4 and the cathode region 9 is divided into a plurality of junctions Jn by a plurality of the division regions 30 and the buried isolation regions 6. When a reverse bias voltage is applied to the photodiode PD for operating the photodiode PD, depletion layers are extended from each of the divided p-n junctions Jn and from each of the p-n junctions j between the division layers 30 and cathode region 9. In FIG. 7, chain lines "a" and "a'" each designate the extension of the depletion layer. It should be noted that in FIG. 7, parts corresponding to those shown in FIG. 5 are designated by the same characters and the overlapped explanation thereof is omitted.

As shown in FIG. 7, the extension of the depletion layer from each of the divided p-n junctions Jn to the anode region 4 side is shallower than the buried isolation region 6, and therefore, the depletion layer is divided into two parts by the buried region 6.

In the case of the semiconductor device including a photodiode having a configuration shown in FIGS. 6A or 6B, that is, so-called photo-IC, in which light spots are formed on the divided parts A, B, C and D or A', B', C' and D', that is, on each division region 30 and the buried isolation region 6 formed thereunder, the frequency characteristic of the photodiode is degraded for the following reason:

The frequency characteristic of the photodiode is mainly determined by a CR time constant depending on a parasitic capacitance (C) and a parasitic resistance (R), a time required for carriers to migrate in a depletion layer of the photodiode, and a time required for carriers to diffuse in a non-depleted semiconductor layer.

Accordingly, in the above-described photodiode PD divided into four parts, the frequency characteristic differs between a portion near the division region 30 and the buried isolation region 6, and a position sufficiently apart therefrom.

This will be more fully described with reference to FIG. 7. Minority carriers, that is, electrons "e" generated in the buried isolation region 6 and a portion, near the region 6, of the anode region 4 by light irradiation receive, from the region 6, forces in the direction in which the electrons "e" are separated from the region 6 as shown by an arrow "b" because the potential of the region 6 acts as a barrier against the electrons "e", minority carriers. As a result, the electrons "e" generated in the buried isolation region 6 and a portion, near the region 6, of the anode region 4 migrate toward the depletion layer not along a straight line but along a curved line. On the contrary, electrons "e" generated in a portion sufficiently apart from the buried isolation region 6 are not affected or little affected by the potential of the region 6, and therefore, they migrate to the depletion layer along a straight line as shown an arrow "c". That is to say, electrons generated in the buried isolation region 6 and its neighborhood are longer than electrons generated at a portion sufficiently apart from the region 6 in terms of migration distance to the depletion layer, that is, diffusion time of carriers. As a result, the frequency characteristic of the buried isolation region 6 and its neighborhood is degraded.

Accordingly, in the case of the above-described photodiode divided into four parts, when a light spot is formed on an area including the isolation regions between the four divided parts, that is, the buried isolation regions 6, the ratio of the area of the isolation regions to the light irradiation area becomes large, thereby causing a problem associated with the frequency characteristic. In particular, since the RF signal is obtained by adding signals outputted from the divided parts of the photodiode including the regions 6, it is affected by the degradation of the frequency characteristic at the regions 6. The RF signal most required to ensure a high speed performance is seriously affected by the degradation of the frequency characteristic at the regions 6.

The light receiving sensitivity of a photodiode is determined by a ratio of those, reaching a depletion layer, without generation of recombination, of carriers (electron-positive hole pairs) generated by photoelectric conversion.

The light receiving sensitivity at the isolation portion of a photodiode will be examined. Referring to FIG. 7, incident light at the isolation portion of the photodiode enters the division region 30, buried isolation region 6, and anode regions 4, 3 and 2. In the division region 30 and the buried isolation region 6, which are positioned near the surface of the semiconductor substrate and thereby have a large light absorption, since the impurity concentration is high, the diffusion lengths of carriers generated in the vicinity of the regions 30 and 6 are short, so that there is a large possibility that the carriers could be lost by recombination before reaching the depletion layer.

The carriers generated in the anode regions 4, 3 and 2 are longer in migration distance to the depletion layer as described above, there is a large possibility that the carriers might be lost by recombination during migration.

As a result, the light receiving sensitivity is degraded at the isolation portion of the photodiode.

Accordingly, in the case of the above-described photodiode divided into four parts, when a light spot to be detected is formed on an area including the isolation regions between the four divided parts, that is, the division region 30 and buried isolation regions 6, since the ratio of the vertical sectional area of the division and isolation regions to the light irradiation area becomes large and further the width of each isolation region may be sometimes wider on the basis of the design of an optical pickup, the degradation of the light receiving sensitivity in the division or isolation region causes a large problem.

SUMMARY OF THE INVENTION

An object of the present invention is to provide a photodetector, typically, a photodiode capable of improving the frequency characteristic even if the photodetector is configured such that a division portion and its neighborhood is irradiated with light.

Another object of the present invention is to provide a photodetector, typically, a photodiode capable of improving the light receiving sensitivity even if the photodetector is configured such that a division portion and its neighborhood is irradiated with light.

To achieve the above objects, according to a first aspect of the present invention, there is provided a semiconductor device including a photodetector having a junction at which a first conductive type first semiconductor portion and a second conductive type second semiconductor portion are joined to each other, the photodetector being formed on a semiconductor substrate. In this semiconductor device, division regions are formed in part of the first semiconductor portion in such a manner as to cross the first semiconductor portion and partially enter the second semiconductor portion, so that the junction is divided into a plurality of parts by the division regions, to form a plurality of photodetector regions having the divided junction parts; and when a reverse bias voltage, which is equal to or less than a specific reverse bias voltage applied to the divided junction parts upon operation of the photodetector, is applied to the divided junction parts, depletion layers originated from two divided junction parts, disposed on both the sides of each of the division regions, of the plurality of divided junction parts extend, in the second semiconductor portion, under the division region to be brought into contact with each other.

With this configuration of the above semiconductor device, when a reverse bias voltage equal to or less than the specific value is applied to each of the divided p-n junction parts, the adjacent depletion layers via each division region extend under the division region to be brought into contact with each other, and accordingly, the division region between the photodetector regions becomes shallower than the prior art division region which includes the buried isolation region. As a result, the absorption wavelength of light incident on this division region is reduced, to enhance the light receiving sensitivity of the photodetector.

Further, when a reverse bias voltage equal to or less than the specific value is applied to each of the divided p-n junction parts, the adjacent depletion layers via each division region extend under the division region to be brought into contact with each other, and accordingly, it is possible to avoid the occurrence of such a potential barrier of the division region as to cause the roundabout of carriers generated under the depletion layer by light irradiation, and hence to avoid the degradation of the frequency characteristic due to the roundabout of the carriers.

According to a second aspect of the present invention, there is provided an optical pickup system including: a semiconductor light emitting device; a photodetector having a junction at which a first conductive first type semiconductor portion and a second conductive second type semiconductor portion are joined to each other, said photodetector being formed on a semiconductor substrate; and an optical system. In this photodetector, division regions are formed in part of said first semiconductor portion in such a manner as to cross said first semiconductor portion and partially enter said second semiconductor portion, so that said junction is divided into a plurality of parts by said division regions, to form a plurality of photodetector regions having said divided junction parts; and when a reverse bias voltage, which is equal to or less than a specific reverse bias voltage applied to said divided junction parts upon operation of said photodetector, is applied to said divided junction parts, depletion layers originated from two divided junction parts, disposed on both the sides of each of the division regions, of said plurality of divided junction parts extend, in said second semiconductor portion, under said division region to be brought into contact with each other.

With this configuration of the optical pickup system, since the semiconductor device is so configured as described above, it is possible to realize a good frequency characteristic and a good light receiving sensitivity even if an area including isolation regions for isolating a plurality of divided photodiode parts from each other is irradiated with light to obtain an RF signal requiring a high speed performance, or a very thin stripe pattern or a thick pattern of the photodiode, typically used for a so-called laser coupler, is irradiated with light.

According to the present invention, the semiconductor device can be fabricated by the steps, the number of which is substantially the same as that of the steps of the prior art fabrication method, and accordingly, the optical pickup system using the semiconductor device can be fabricated by the steps, the number of which is substantially the same as that of the steps of the prior art fabrication method.

DETAILED DESCRIPTION OF THE PREFERRED EMBODIMENTS

Hereinafter, embodiments of the present invention will be described with reference to the accompanying drawings.

Figure 1:
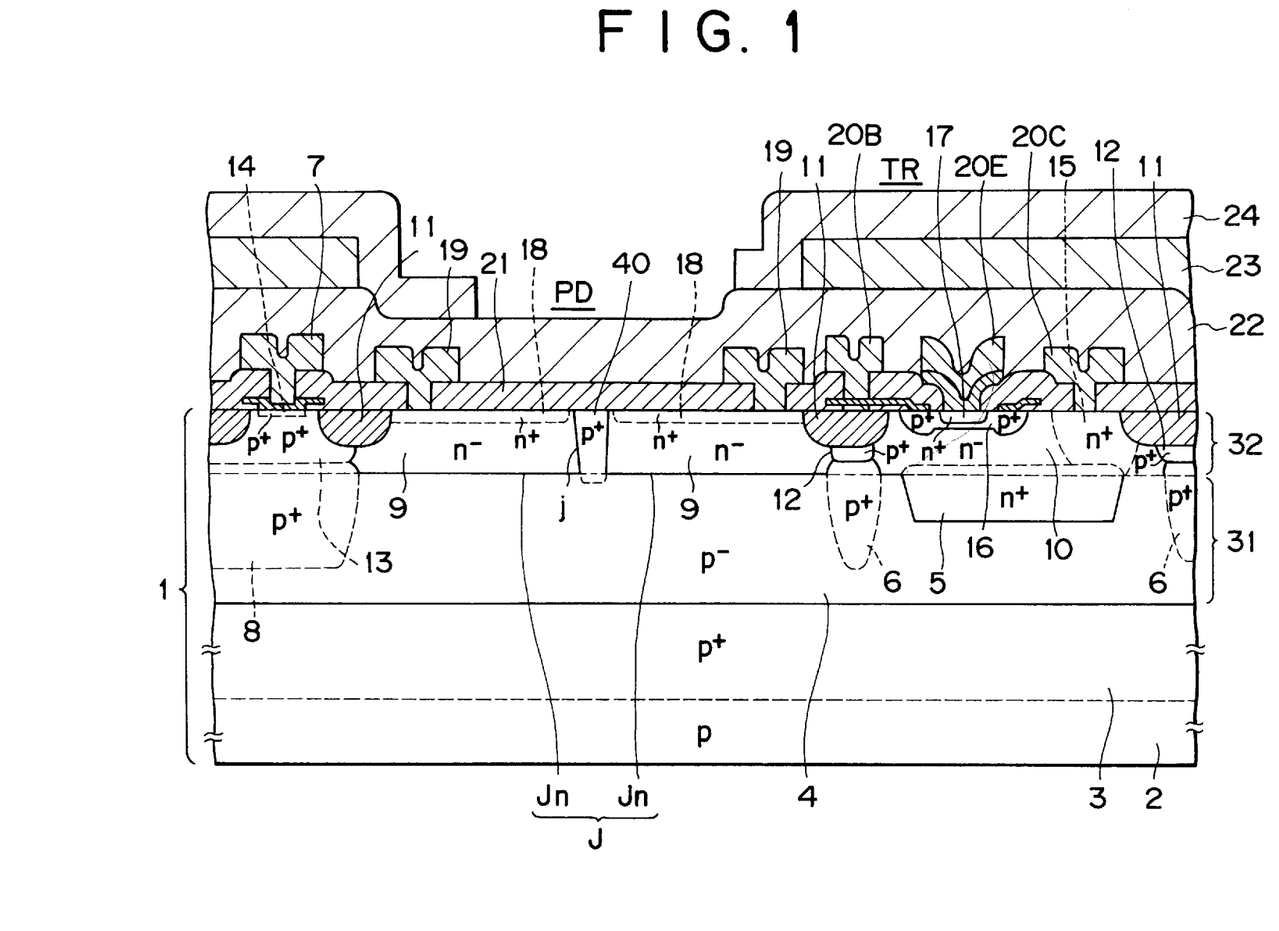
FIG. 1 is a schematic sectional view of an embodiment of a semiconductor device according to the present invention.

FIG. 1 is a schematic sectional view of an embodiment of a semiconductor device of the present invention.

Referring to FIG. 1, a photodiode PD as a photodetector having a p-n junction J between a first conductive type first semiconductor portion 9 and a second conductive type second semiconductor portion 4 is formed in a semiconductor substrate 1.

Division regions 40 (only one region 40 is shown in FIG. 1) are formed in the first semiconductor portion 9 at selected positions in such a manner as to cross the first semiconductor portion 9. The junction J is divided by the division regions 40 into a plurality of junction parts Jn, and simultaneously a photodetector region is divided by the junction parts Jn into a plurality of photodetector regions.

Figure 2:
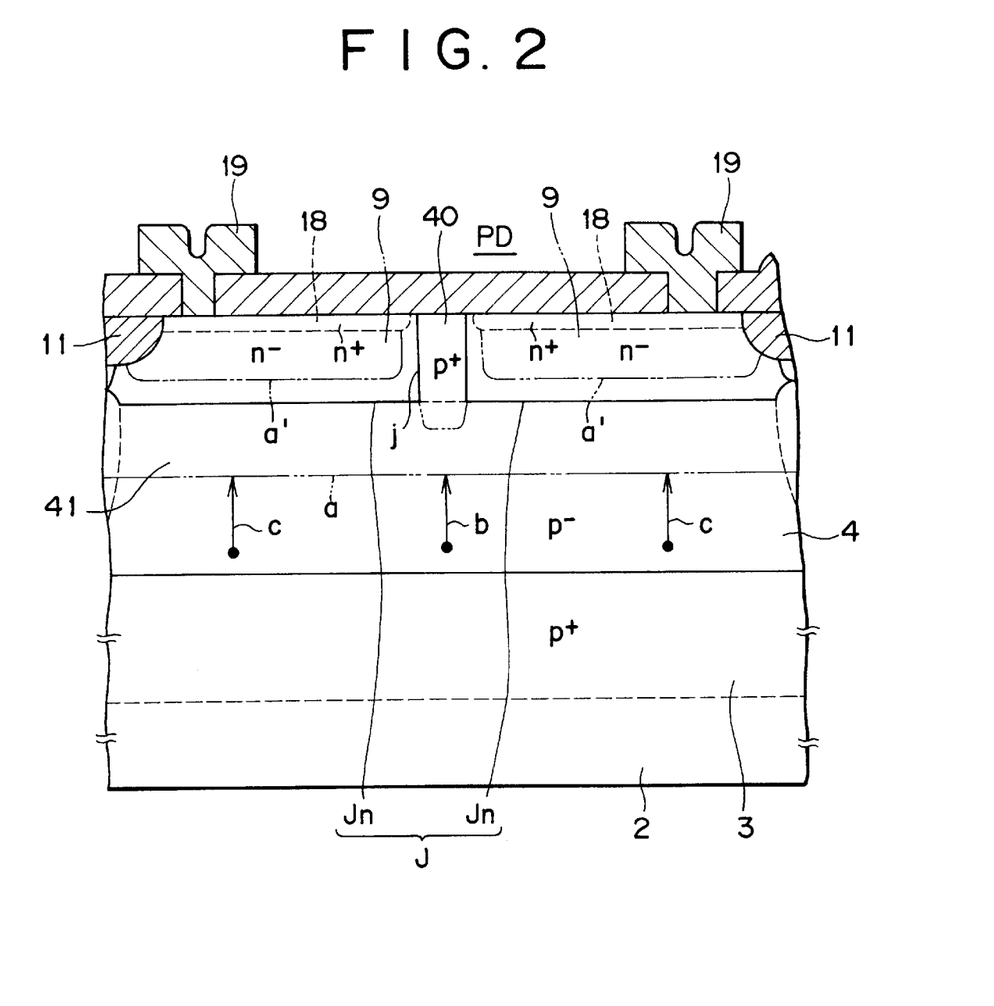
FIG. 2 is a schematic sectional view of an essential portion of the semiconductor device shown in FIG. 1 for illustrating the operation of the semiconductor device.

The photodiode PD as the photodetector in this embodiment is configured as follows: namely, when a reverse bias voltage in a range of 0.3 V to 11.0 V, typically, in a range of 0.5 V to 2.5 V, which is equal to or less than that applied to the junction parts Jn upon operation of the photodiode, is applied to the junction parts Jn, as shown in FIG. 2 (which is a schematic sectional view of an essential portion of the photodiode PD), depletion layers originated from the divided junction parts Jn on both the sides of each of the division regions 40 extend, in the second semiconductor portion 4, under the division region 40 to be brought into contact with each other. In this way, as shown in FIG. 2, the depletion layers shown by a chain line "a", which are continues to each other with part of the division region 40 put therebetween, are formed. In addition, a depletion layer shown by a chain line "a'", which extends from a junction "j" between each division region 40 and the first semiconductor layer 9, is also formed.

It should be noted that in FIG. 2, parts corresponding to those shown in FIG. 1 are designated by the same characters and the overlapped explanation thereof is omitted.

Referring again to FIG. 1, a high impurity concentration third semiconductor portion 18 having the same conductive type as that of the first semiconductor portion 9 is formed on the surface of each of portions, isolated from each other by the depletion layers, of the first semiconductor portion 9.

The thickness of the third semiconductor portion 18 is set in a range of 0.01 $\mu$m to 0.2 $\mu$m.

A fourth semiconductor portion 3 having an impurity concentration higher than that of the second semiconductor portion 4 is formed on the side, opposite to the junction J constituting the photodetector, of the second semiconductor portion 4 in such a manner as to be in contact with the second semiconductor portion 4.

In this case, the distance between the surface of the semiconductor substrate 1 and the fourth semiconductor portion 3 is selected to be larger than the absorption wavelength of light incident on the photodetector.

The semiconductor device shown in FIG. 1 is configured as a bipolar IC, used as a photo-IC, in which an npn type transistor TR and the anode common type photodiode PD are formed on the same semiconductor substrate 1. In this bipolar IC, the photodiode PD is generally divided into a plurality of parts as shown in FIG. 6A or 6B; however, the photodiode PD shown in FIG. 1 is divided into two parts for an easy understanding.

The semiconductor device in this embodiment is fabricated as follows:

A high impurity concentration p-type buried layer 3 equivalent to the above-described fourth semiconductor portion is formed overall on one principal plane of a p-type Si semiconductor base substrate 2. A low impurity concentration p-type first semiconductor layer 31 for forming the anode region 4 of the photodiode, which is equivalent to the above-described second semiconductor portion is formed on the buried layer 3 by epitaxial growth. A high impurity concentration collector buried region 5 is formed in a transistor TR formation portion of the first semiconductor layer 31. Then, high impurity concentration buried isolation regions 6 are formed between respective circuit elements.

It should be noted that at the above fabrication steps, as the feature of the present invention, the buried region 6 is not provided at each division portion of the photodiode PD unlike the prior structure shown in FIGS. 5 and 7.

A high impurity concentration p-type buried region 8 is formed in a portion at which an anode electrode 7 of the photodiode PD is to be formed.

A cathode region 9 of the photodiode PD, equivalent to the above-described first semiconductor portion, and a low impurity concentration n-type second semiconductor layer 32 for forming a collector region 10 of the transistor TR are formed on the first semiconductor layer 31.

In this way, the first and second semiconductor layers 31 and 32 are formed on the semiconductor base substrate 2 by expitaxial growth, to form an Si semiconductor substrate 1. Then, insulating isolation layers 11 made from $SiO_2$ are formed, by LOCOS, are formed on the surface of the semiconductor substrate 1, that is, on the second semiconductor layer 32 in order to electrically isolate semiconductor circuit elements or regions from each other.

A high impurity concentration p-type isolation region 12 is formed in the second semiconductor layer 32 at a position between each of the insulating isolation layers 11 provided between circuit elements and the buried isolation region 6 provided below the layer 11. A high impurity concentration p-type anode electrode extraction region 13 is formed on the high impurity concentration buried region 8 under the anode electrode 7 formation portion, and a high impurity concentration anode contact region 14 is formed thereon.

Next, as the feature of the semiconductor device in this embodiment, a p-type division region having an impurity concentration higher than that of the cathode region 9 (equivalent to the first semiconductor portion) is formed at each division position in the photodiode PD formation portion.

The planar pattern of the division region 40 is taken as a cruciform pattern, if the photodiode PD is configured as the photodiode $PD_0$ shown in FIG. 6A, or is taken as a three parallel stripe pattern, if the photodiode PD is configured as the photodiode $PD_1$ or $PD_2$ shown in FIG. 6B.

The division region 40 is, as shown in FIG. 1, formed in such a manner as to cross the anode region 4 and partially enter the cathode region 9, thereby dividing the p-n junction J into parts.

Then, a high impurity concentration n-type collector electrode extraction region 15 and a p-type base region 16 are formed in the collector region 10, and an n-type emitter region 17 is formed on a base region 16.

A cathode region 18 having an impurity concentration higher than that of the cathode region 9, which is equivalent to the above-described third semiconductor portion, is formed on each of parts of the cathode region 9 divided by the division regions 40 of the photodiode PD. A cathode electrode 19 is brought into ohmic-contact with each cathode region 18.

An insulating layer 21 made from $SiO_2$ is deposited on the surface of the semiconductor substrate 1, and electrode contact windows are formed in the insulating layer 21. An emitter electrode 20E, a base electrode 20B, and a collector electrode 20C of the transistor TR are brought into contact with the regions 15, 16, and 17 through the electrode contact windows, respectively, and an interlayer insulating layer 22 made from $SiO_2$ is formed thereon. A light shading layer 23 made from Al, which has a light receiving window, is formed on the interlayer insulating layer 22, and a protective layer 24 is formed thereon.

The photodiode PD is irradiated with a light ray to be detected through the light receiving window of the light shading layer 23. In this case, the insulating layers 21 and 22 act as a reflection preventive film.

With respect to the photodiode PD having the above configuration, a specific reverse bias voltage is applied between the anode electrode 14 and the cathode electrode 19 upon operation of the photodiode PD, and according to the present invention, the photodiode PD is configured as follows: namely, under a reverse bias voltage equal to or less than the above specific reverse bias voltage, as shown in FIG. 2, depletion layers (shown by the chain line "a") originated from the divided p-n junction parts Jn disposed between the cathode region 9 and the anode region 4 and on both the sides of each division region 40 extend under the division region 40 to be brought into contact with each other. That is to say, the depth of the division region 40 is selected such that, in the state in which the reverse bias voltage is applied, the depletion layers originated from the divided p-n junction parts Jn disposed on both the sides of the division region 40 extend under the division region 40 to be brought into contact with each other.

In this way, when the reverse bias voltage is applied, a p-n junction "j" (shown by the chain line "a'") between the division region 40 and the cathode region 9, and a depletion layer 41 (shown by the chain line "a") extending from the division p-n junction parts Jn disposed between the cathode region 9 and the anode region 4 and on both the sides of the division region 40 are formed at each division portion of the cathode region 9, that is, the first semiconductor portion.

Here, the cathode region (first semiconductor portion) 9 is specified such that the thickness is in a range of 0.01 to 10 $\mu$m and the impurity concentration is in a range of $1 \times 10^{11}$ to $1 \times 10^{16}$ atoms/cm$^3$.

The anode region (second semiconductor portion) 4 is specified such that the thickness is in a range of 0.01 to 600 $\mu$m and the impurity concentration is in a range of $1 \times 10^{11}$ to $1 \times 10^{16}$ atoms/cm$^3$.

The high impurity concentration region (third semiconductor portion) 18 is specified such that the thickness is in a range of 0.01 to 0.2 $\mu$m and the impurity concentration is in a range of $1 \times 10^{15}$ to $1 \times 10^{21}$ atoms/cm$^3$.

The buried layer (fourth semiconductor portion) 3 is specified such that the thickness is in a range of 1 to 30 $\mu$m and the impurity concentration is in a range of $1 \times 10^{16}$ to $1 \times 10^{21}$ atoms/cm$^3$.

The buried isolation layer 6 is specified such that the thickness is in a range of 0.01 to 10 $\mu$m and the impurity concentration is in a range of $1 \times 10^{14}$ to $1 \times 10^{21}$ atoms/cm$^3$.

With respect to the above impurity concentrations of the first and second semiconductor portions, it may be desirable that the impurity concentration of the second semiconductor portion is set in a range of $2 \times 10^{14}$ atoms/cm$^3$ or less in order that the depletion layer 41 can perfectly deplete the anode region 4 (second semiconductor portion), that is, can reach up to the buried layer 3 (fourth semiconductor portion), and it may be more desirable that the impurity concentration is set in a range of $5 \times 10^{14}$ atoms/cm$^3$ or less in order that the depletion layer 41 can deplete the cathode region 9 (first semiconductor portion).

In addition, the dependence of impurity concentration on the reverse bias voltage and extension of the depletion layer in the p-n junction is known, for example, from [Yonezu, "Optical Communication Device Optics", p329, published by Kougaku Tosho Kabushiki Kaisha].

To make photoelectric conversion effective, as described above, the distance between the surface of the semiconductor substrate 1 and the fourth semiconductor portion 3 is selected to be larger than the absorption wavelength of light incident on the photodetector.

According to the above-described semiconductor device of the present invention, since the depletion layer 41 extending under the high impurity concentration division region 40 is formed upon operation of the photodetector of the semiconductor device, minority carriers, that is, electrons in this embodiment generated by light irradiation in the anode region 4 (second semiconductor portion) can reach the depletion layer 41 with their migration lengths kept nearly constant, as shown by arrows "b" and "c" designating migration routes in FIG. 2, that is, without being curved by the potential due to the presence of the division region 40 or isolation region, with a result that the frequency characteristic of the photodetector can be improved.

Further, since the depletion layer 41 extends around the underside of the high impurity concentration division (isolation) region 40, minority carriers generated in the anode region (second semiconductor portion) 4 by light irradiation can reach the depletion layer while keeping nearly constant the migration lengths to the depletion layer irrespective of the presence or absence of the isolation portion, with a result that the light receiving sensitivity at the isolation portion is not degraded even if the isolation portion has a wide width. Additionally, with respect to the photodetector, that is, the photodiode PD configured such that an area including each division portion is irradiated with light, the depth of the division region 40 is set at such a value as for the region 40 to cross the first semiconductor portion 9. As a result, the cross-section of the division region 40 can be reduced. This means that the diffusion lengths of the minority carriers at a high concentration to the division region 40 become short. Accordingly, it is possible to reduce the quantity of light absorbed by the division region 40, and hence to improve the sensitivity.

The semiconductor device in this embodiment is configured as a photo-IC in which the transistor is formed as another circuit element, together with the photodetector, that is, the photodiode, on the common semiconductor substrate 1; however, it may be configured as an IC in which a pnp type transistor, a resistance element and a capacitor configured by semiconductor regions, and the like are formed as other circuit elements, together with the photodetector, on the common semiconductor substrate 1.

In FIG. 1, only one photodiode PD divided into a plurality of parts is shown as the photodetector; however, the present invention can be applied to a photo-IC in which as shown in FIGS. 6A and 6B, one divided photodiode, a non-divided photodiode, and a plurality of photodiodes composed of divided photodiodes are formed on the common semiconductor substrate 1.

Figure 3:
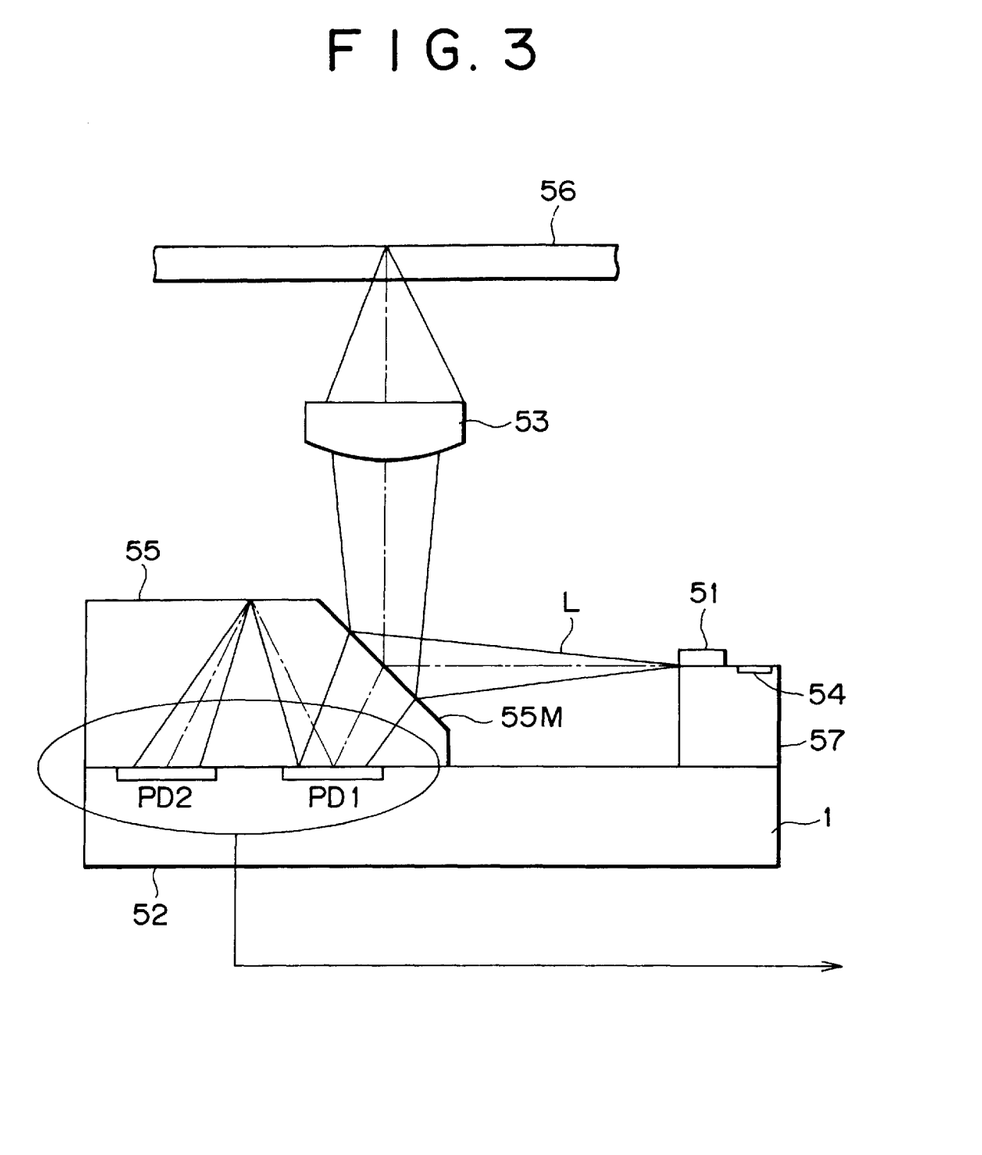
FIG. 3 is a configuration view of an embodiment of an optical pickup system according to the present invention.

FIG. 3 is a schematic view showing the configuration of an optical pickup system of the present invention, which includes the semiconductor device having a photodetector according to the present invention.

The optical pickup system includes a laser coupler, and an optical system 53, that is, an objective lens. The laser coupler integrally includes a semiconductor light emitting device, typically, a semiconductor laser 51 and a semiconductor device 52 having a photodetector according to the present invention.

The semiconductor device 52 includes two photodiodes $PD_1$ and $PD_2$ shown in FIG. 6B. To be more specific, the semiconductor device 52 including the photodiodes $PD_1$ and $PD_2$ each having the same configuration as that of the photodiode PD shown in FIG. 1 and other circuit elements are formed on a semiconductor substrate 1. A block 57, on or in which the semiconductor laser 51 and a monitor photodetector 54 configured as a general photodiode for monitoring the output of the semiconductor laser 51 for detecting a rearward light ray emitted from the semiconductor laser 51 are mounted or fabricated, is also mounted on the semiconductor substrate 1.

A micro-prism 55 is mounted on the semiconductor substrate 1 of the semiconductor device 52 at a position over the photodiodes $PD_1$ and $PD_2$.

A forward laser light ray L emitted from the semiconductor laser 51 is reflected from a tilt plane 55M of the micro-prism 55, to be made incident on an optical recording medium 56, typically, an optical disk through the optical system 53. The light ray reflected from the medium 56 is returned to the micro-prism 55, being bent by the tilt plane 55M to be introduced in the prism 55, and is made incident on one photodiode $PD_1$ of the semiconductor device 52. The light ray reflected from the photodiode $PD_1$ is made incident on the other photodiode $PD_2$ of the semiconductor device 52. The optical recording medium 56 has recording information pits and grooves for obtaining tracking signals, and accordingly, by calculating the above-described outputs A to D and A' to D' with respect to the return light ray having been made incident on the photodiodes $PD_1$ and $PD_2$, the tracking error signal, focus error signal, and RF signal can be obtained. The positional relationship between the optical recording medium and the laser light ray emitted thereto can be controlled on the basis of the tracking error signal and the positional adjustment (focusing adjustment) of the optical system 53 is performed on the basis of the focus error signal, in accordance with a known control process (not shown).

A rearward laser light ray emitted from the semiconductor laser 51 is made incident on the monitor photodetector 54, to detect the output of the rearward laser light ray equivalent to the forward laser light rays L, thereby setting the output at a specific value by controlling a drive voltage applied to the laser 51.

The optical pickup system having the above configuration allows not only accurate tracking and focusing, but also obtainment of the RF signal having a high S/N ratio because the photodetector, that is, photodiode has excellent frequency characteristic and light receiving sensitivity.

Next, one embodiment of a method of fabricating a semiconductor device having a photodetector according to the present invention, which device has been already described with reference to FIG. 1, will be described with reference to FIGS. 4A and 4B.

Figure 4A:
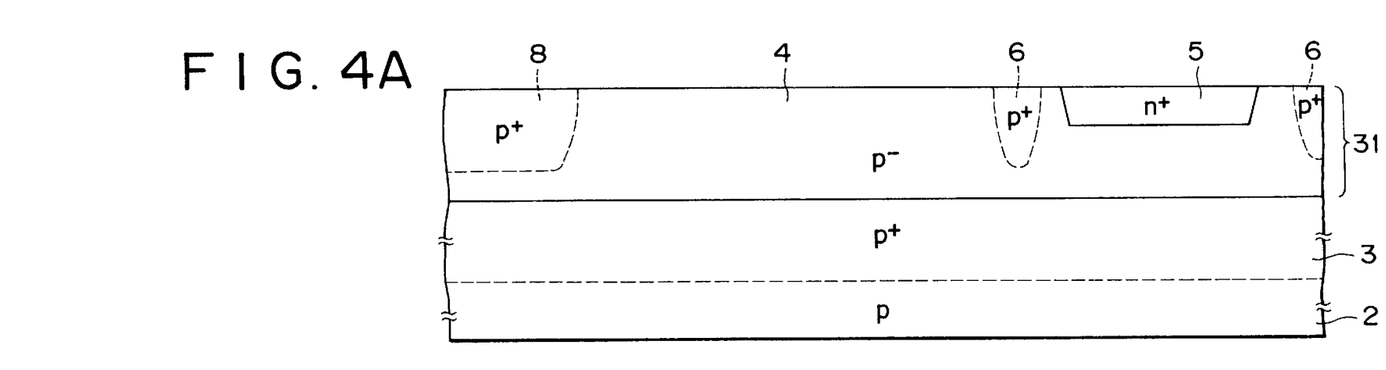
FIGS. 4A and 4B are views illustrating an embodiment of a fabrication method according to the present invention.

Referring to FIG. 4A, a first conductive type (for example, p-type) Si semiconductor base substrate 2 is prepared. While not shown, an oxide film having a thickness of about 120 nm is formed on the surface of the semiconductor base substrate 2 by thermal oxidation, and boron ions (B+) are implanted at an implantation energy of 30 keV in a dose of $2.5 \times 10^{15}$/cm$^2$ overall in one principal plane of the semiconductor base substrate 2 through the oxide film.

The base substrate 2 is annealed in an $N_2$ atmosphere kept at 1200° C. for 80 min for activating boron ions thus implanted.

The base substrate 2 is further heat-treated in a so-called wet $O_2$ atmosphere kept at 1200° C. for 20 min in order to remove defects caused by damage upon ion implantation, to form a p-type buried layer 3. The oxide film is then removed by using hydrofluoric acid.

A first semiconductor layer 31 having the same conductive type (p-type) as that of the buried layer 3 is formed by epitaxial growth on the principal plane of the semiconductor base substrate 2, that is, on the buried layer 3 to a thickness of 20 μm. The resistivity of the first semiconductor layer 31 is set at 50 Ωcm.

While not shown, the surface of the first semiconductor layer 31 is subjected to thermal oxidation, to form an oxide film having a thickness of 120 nm, and the surface of the oxide film is coated with a photoresist, followed by pattern exposure and development, to form a photoresist film having a specific pattern. The oxide film formed on the surface of the first semiconductor layer 31 is etched by using the photoresist film as a mask, to form openings in the oxide film. The photoresist film is then removed by using a mixed solution of hydrogen peroxide and $H_2SO_4$. Boron ions (B+) are implanted at an implantation energy of 30 keV in a dose of $2.5 \times 10^{15}$/cm$^2$ in the first semiconductor layer 31 at the periphery of a photodiode formation portion and at portions for isolation between circuit elements through the above openings.

The base semiconductor 2 is annealed in an $N_2$ atmosphere kept at 1200° C. for 80 min for activating boron ions thus implanted.

The base substrate 2 is further subjected to oxidation in a so-called wet $O_2$ atmosphere kept at 1200° C. for 20 min in order to remove defects caused by damage upon ion implantation, to form p-type buried isolation regions 6 and a high impurity concentration buried region 8 for extraction of an electrode of an anode region of the photodiode.

A photoresist film of a specific pattern having an opening at a position equivalent to a transistor formation portion is formed on the first semiconductor layer 31. The oxide film formed on the surface of the first semiconductor layer 31 is etched by using the photoresist film as a mask, to form an opening in the oxide film. The photoresist film is then removed by using a mixed solution of hydrogen peroxide and sulfuric acid.

A second conductive type (n-type in this embodiment) collector buried region 5 is formed in the first semiconductor layer 31 through the opening formed in the oxide film by thermal diffusion using $Sb_2O_3$ as a solid source at 1200° C. for 60 min.

The oxide film is then removed by heat-treatment using hydrofluoric acid.

Figure 4B:
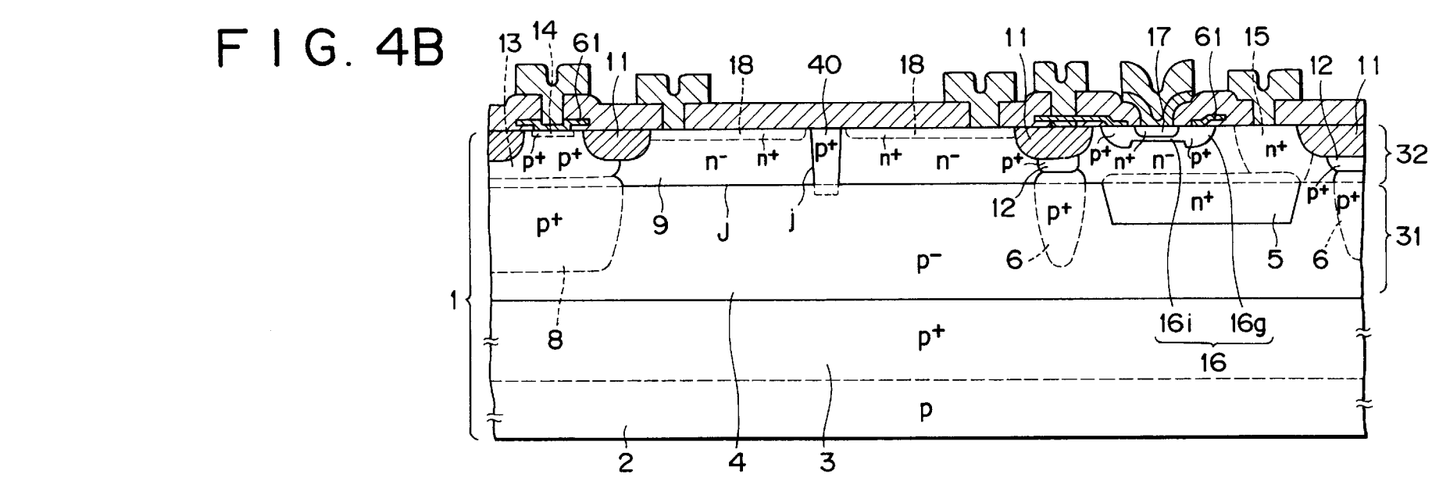

Next, as shown in FIG. 4B, a second conductive type, that is, n-type second semiconductor layer 32 (thickness: 1.6 μm, resistivity: 1 Ωcm) is formed by epitaxial growth on the first semiconductor layer 31, to form a semiconductor substrate 1. At this time, by the heating upon epitaxial growth of the second semiconductor layer 32, the impurities contained in the high impurity concentration collector buried region 5, high impurity concentration buried isolation regions 6, and high impurity concentration buried region 8 formed in the first semiconductor layer 31 are diffused in the second semiconductor layer 32, whereby the regions 5, 6 and 8 enter the second semiconductor layer 32.

Insulating isolation layers 11 are formed by LOCOS as follows: namely, the surface of the second semiconductor layer 32 is subjected to thermal oxidation, to form an oxide film made from $SiO_2$ having a thickness of 20 nm, and a silicon nitride ($SiO_xN_y$) film having a thickness of 65 nm is deposited on the oxide film by a low pressure CVD process; the oxide film, nitride film and the second semiconductor layer 32 are selectively etched by RIE (reactive Ion Etching) to a thickness of about 400 nm; and the second semiconductor layer 32 is subjected to wet $O_2$ atmosphere kept at 1050° C. by using the remaining nitride film as an antioxidation mask, to form the insulating isolating layers 11 having a thickness of 800 nm.

The nitride film is selectively etched at 150° C. by using phosphoric acid, and a high impurity concentration collector electrode extraction region 15 of the first conductive type, that is, n-type is formed on part of the collector buried region 5 of the second semiconductor layer 32 by implanting phosphorus ions (P$^+$) at 70 keV in a dose of $1 \times 10^{16}$/cm$^2$.

The resultant substrate is heat-treated in an N$_2$ atmosphere kept at 1050° C. for 60 min for activating the impurity.

A high impurity p-type isolation region 12, an anode electrode extraction region 13, a division region 40, and a high impurity concentration n-type anode region 18 are formed as follows:

The isolation region 12 and the anode electrode extraction region 13 are formed by selectively implanting boron ions (B$^+$) at 500 kev in a dose of $1 \times 10^{14}$/cm$^2$. The high concentration cathode region 18 is formed by implanting arsenic ions (As+) at 70 keV in a dose of $1 \times 10^{15}$/cm$^2$. The resultant substrate is heat-treated at 1000° C. for 30 min for activating the impurities, to form the high impurity concentration p-type isolation region 12, anode electrode extraction region 13, division region 40, and high impurity concentration n-type cathode region 18.

The high impurity p-type isolation region 12, anode electrode extraction region 13, and division region 40 are simultaneously formed. In this case, since the buried isolation region 6 and the high impurity concentration region 8 are, as described above, formed under the isolation region 12 formation portion and the anode electrode extraction region 13 formation portion in such a manner as to enter the second semiconductor layer 32, respectively, the isolation region 12 and the anode electrode extraction region 13 can be formed in such a manner as to be in contact with the buried isolation region 6 and the high impurity concentration buried region 8, respectively. The division region 40 is, as described above, formed in such a manner as to cross the cathode region 9 formed by the second semiconductor layer 32 and slightly enter the first semiconductor layer 31.

The subsequent steps may be performed in accordance with a general process of fabricating a bipolar transistor IC as follows:

An insulating under layer such as an oxide film is formed on the surface of the second semiconductor layer 32 of the semiconductor substrate 1, and an opening is formed at a base region formation portion of the transistor and also an opening is formed at a position over the anode electrode extraction 13, by photolithography and etching. A first polycrystalline semiconductor layer 61 made from poly-silicon heavily doped with a p-type impurity is formed to block the above openings.

The polycrystalline semiconductor layer 61 is removed, by photolithography and etching, except for the base region formation portion and its electrode extraction portion of the transistor and the anode electrode extraction region 13 and its electrode extraction portion of the photodiode.

An opening is formed in the base region formation portion of the first polycrystalline semiconductor layer 61 at an intrinsic base region 16$i$ formation portion, and an intrinsic base region 16$i$ is formed by diffusing the p-type impurity through the opening. Then, an insulating layer made from SiO$_2$ is formed, to form a surface insulating layer 21 having a specific thickness, together with the insulating under layer previously formed. An opening is formed in the insulating layer 21 at the position corresponding to the intrinsic base region 16$i$, and a second polycrystalline semiconductor layer 62 made from poly-silicon heavily doped with an n-type impurity is formed to block the opening.

The second polycrystalline semiconductor layer 62 is removed, by photolithography and etching, except for an emitter electrode extraction region.

A high impurity concentration p-type graft base region 16$g$ is formed around the intrinsic base region 16$i$, a high impurity concentration anode contact region 14 is formed on the anode electrode extraction region 13, and a high impurity concentration n-type emitter region 17 is formed on the intrinsic base region 16$i$ by diffusing the impurities from the first and second polycrystalline semiconductor layers 61 and 62 to the semiconductor layer 32.

Electrode contact windows are formed in the insulating layer 21. An emitter electrode 20E, a base electrode 20B, and a collector electrode 20C of the transistor TR are brought into contact with the regions 15, 16, and 17 through the electrode contact windows, respectively, and an interlayer insulating layer 22 made from SiO$_2$ is formed thereon. A light shading layer 23 A made from Al, which has a light receiving window, is formed on the interlayer insulating layer 22, and a protective layer 24 is formed thereon.

The photodiode PD is irradiated with a light ray to be detected through the light receiving window of the light shading layer 23. In this case, the insulating layers 21 and 22 act as a reflection preventive film.

In this way, a semiconductor device, in which the transistor TR and the anode common type photodiode PD are formed on the common (or the same) semiconductor substrate 1, is formed.

As described above, according to the semiconductor device of the present invention, the photodiode PD is divided into a plurality of parts by the depletion layers originated from the junctions j and the depletion layers originated from the p-n junction parts J divided from the junction J constituting the photodiode PD by the division regions 40. In other words, the isolation portion of the photodiode PD does not have the buried isolation region 6 of the prior art structure shown in FIG. 7. As a result, since carriers generated in the vicinity of the division or isolation region by light irradiation are prevented from being applied with forces in the direction in which they are separated from the isolation region by the potential of the isolation region, such carriers can migrate from the generation positions to the depletion layers along the shortest route, that is, in straight lines. Consequently, the migration times of the carriers can be made constant irrespective of the light irradiation positions. Accordingly, even if the photodiode PD is configured such that a light spot is formed at the division region, it is possible to obtain an RF signal with a good frequency characteristic.

In the above embodiment, the bipolar transistor TR has a so-called double poly-silicon structure using the first and second polycrystalline semiconductor layers 61 and 62; however, the double poly-silicon structure may be formed by ion implantation, or may be displaced with a so-called single poly-silicon emitter structure in which the emitter region is formed by ion implantation.

The formation of the division region 40 is made simultaneously with the formation of the isolation region 12 in the above embodiment; however, it may be made separately from the formation of the isolation region 12.

Further, the second semiconductor portion (anode region 4 in the above embodiment) is formed by epitaxial growth in the above embodiment; however, it may be formed by the semiconductor base substrate 2 itself.

In the above embodiment, the first conductive type is taken as n-type and the second conductive type is taken as p-type, that is, the photodiode is configured as the anode common type in which the cathode is disposed on the light receiving surface side; however, the conductive type may be reversed to that described above. In this way, the description of the semiconductor device having a photodetector, the fabrication method thereof, and the optical pickup system using the semiconductor device in the above embodiment is for illustrative purposes only, and it is to be understood that changes and variations may be made without departing from the spirit or scope of the following claims.

What is claimed is:

1. A semiconductor device comprising:

a photodetector having a junction at which a first conductive type first semiconductor portion and a second conductive type second semiconductor portion are joined to each other, said photodetector being formed on a semiconductor substrate;

wherein division regions are formed in part of said first semiconductor portion in such a manner as to cross said first semiconductor portion, so that said junction is divided into a plurality of parts by said division regions, to form a plurality of photodetector regions having said divided junction parts; and when a reverse bias voltage, which is equal to or less than a specific reverse bias voltage applied to said divided junction parts upon operation of said photodetector, is applied to said divided junction parts, depletion layers originated from two divided junction parts, disposed on both the sides of each of the division regions, of said plurality of divided junction parts extend, in said second semiconductor portion, under said division region to be brought into contact with each other.

2. A semiconductor device according to claim 1, wherein a first conductive type third semiconductor portion having an impurity concentration higher than that of said first conductive type first semiconductor portion is formed, in each of said plurality of photodetector regions, on said first semiconductor portion.

3. A semiconductor device according to claim 1, wherein a fourth semiconductor portion having an impurity concentration higher than that of said second conductive type second semiconductor portion is formed in said semiconductor substrate in such a manner as to be in contact with the side, opposite to said junction constituting said photodiode, of said second semiconductor portion.

4. A semiconductor device according to claim 3, wherein a distance from the surface of said semiconductor substrate to the surface of said fourth semiconductor portion is selected to be larger than the absorption wavelength of light incident on said photodetector.

5. A semiconductor device according to claim 2, wherein the thickness of said third semiconductor portion is selected to be in a range of 0.01 $\mu$m to 0.2 $\mu$m.

6. A semiconductor device according to claim 1, wherein the concentration of the impurity contained in said second semiconductor portion for forming said photodetector is selected to be in a range of $1\times10^{11}$ to $1\times10^{16}$ atoms/cm$^3$.

7. A semiconductor device according to claim 1, wherein the concentration of the impurity contained in each of said first and second semiconductor portions for forming said photodetector is selected to be in a range of $1\times10^{11}$ to $1\times10^{16}$ atoms/cm$^3$.

8. An optical pickup system comprising:

a semiconductor light emitting device;

a photodetector having a junction at which a first conductive type first semiconductor portion and a second conductive type second semiconductor portion are joined to each other, said photodetector being formed on a semiconductor substrate; and an optical system;

wherein division regions are formed in part of said first semiconductor portion in such a manner as to cross said first semiconductor portion and partially enter said second semiconductor portion, so that said junction is divided into a plurality of parts by said division regions, to form a plurality of photodetector regions having said divided junction parts; and when a reverse bias voltage, which is equal to or less than a specific reverse bias voltage applied to said divided junction parts upon operation of said photodetector, is applied to said divided junction parts, depletion layers originated from two divided junction parts, disposed on both the sides of each of the division regions, of said plurality of divided junction parts extend, in said second semiconductor portion, under said division region to be brought into contact with each other.

* * * * *